United States Patent
Ngai

(10) Patent No.: US 9,525,419 B2
(45) Date of Patent: Dec. 20, 2016

(54) HETEROGENEOUS SEGMENTED AND DIRECT ROUTING ARCHITECTURE FOR FIELD PROGRAMMABLE GATE ARRAY

(71) Applicant: Tony Kai-Kit Ngai, Saratoga, CA (US)

(72) Inventor: Tony Kai-Kit Ngai, Saratoga, CA (US)

(73) Assignee: EFINIX, INC., Milpitas, CA (US)

( * ) Notice: Subject to any disclaimer, the term of this patent is extended or adjusted under 35 U.S.C. 154(b) by 0 days.

(21) Appl. No.: 14/044,741

(22) Filed: Oct. 2, 2013

(65) Prior Publication Data
US 2014/0097869 A1    Apr. 10, 2014

Related U.S. Application Data

(60) Provisional application No. 61/711,148, filed on Oct. 8, 2012.

(51) Int. Cl.
| | |
|---|---|
| H03K 19/177 | (2006.01) |
| H03K 19/0175 | (2006.01) |
| G06F 17/50 | (2006.01) |
| H03K 19/173 | (2006.01) |

(52) U.S. Cl.
CPC ... H03K 19/017581 (2013.01); G06F 17/5054 (2013.01); H03K 19/1737 (2013.01); H03K 19/17728 (2013.01); H03K 19/17736 (2013.01)

(58) Field of Classification Search
CPC .......... G05B 2219/15057; G05B 2219/34024; G05B 2219/34026; G06F 17/50; G06F 17/5027; G06F 17/5054; H03K 19/1737; H03K 19/17704; H03K 19/17728; H03K 19/17732; H03K 19/17736

USPC .................. 326/37, 38, 39, 41, 47
See application file for complete search history.

(56) References Cited

U.S. PATENT DOCUMENTS

| | | | | |
|---|---|---|---|---|
| 5,740,069 A * | 4/1998 | Agrawal | ............ | H03K 19/1737 326/41 |
| 5,883,525 A * | 3/1999 | Tavana | ............. | H03K 19/17704 326/39 |
| 6,069,490 A * | 5/2000 | Ochotta | ........... | H03K 19/17728 326/39 |
| 6,157,211 A * | 12/2000 | Kean | ................... | H03K 19/1776 326/38 |
| 6,275,064 B1 * | 8/2001 | Agrawal | .......... | H03K 19/17728 326/38 |
| 6,292,018 B1 * | 9/2001 | Kean | ................... | G06F 17/5054 326/39 |
| 6,292,022 B2 * | 9/2001 | Young | .............. | H03K 19/17728 326/39 |
| 6,879,184 B1 * | 4/2005 | Fisk | ................. | H03K 19/17728 326/41 |
| 7,146,583 B1 * | 12/2006 | Sun | ..................... | G06F 17/5045 716/113 |

(Continued)

*Primary Examiner* — Jason M Crawford
*Assistant Examiner* — Kurtis R Bahr
(74) *Attorney, Agent, or Firm* — Blakely, Sokoloff, Taylor & Zafman LLP

(57) ABSTRACT

A method and apparatus is disclosed herein for segmented and direct routing in a programmable gate array. In one embodiment, the programmable gate array comprises a plurality of programmable tiles, including at least one SHLRT having: a block configurable as a logic function or a routing function; and one or more switching blocks coupled to programmable tiles in the plurality of programmable tiles for segmented routing.

20 Claims, 8 Drawing Sheets

(56) References Cited

U.S. PATENT DOCUMENTS

| | | | | |
|---|---|---|---|---|
| 7,380,035 B1* | 5/2008 | Donlin | ............. | H03K 19/17732 710/116 |
| 7,385,420 B1* | 6/2008 | Kundu | ................... | G11O 5/063 326/38 |
| 7,521,961 B1* | 4/2009 | Anderson | ........ | H03K 19/17736 326/41 |
| 7,831,943 B1* | 11/2010 | Das | ..................... | G06F 17/5054 716/106 |
| 7,930,661 B1* | 4/2011 | Trimberger | ......... | G06F 17/5054 716/100 |
| 2008/0074142 A1* | 3/2008 | Henderson | ....... | H03K 19/17732 326/41 |

* cited by examiner

HETEROGENEOUS SEGMENTED AND DIRECT ROUTING ARCHITECTURE FOR FIELD PROGRAMMABLE GATE ARRAY

PRIORITY

The present patent application claims priority to and incorporates by reference the corresponding provisional patent application Ser. No. 61/711,148, titled, "Heterogeneous Segmented and Direct Routing Architecture for Field Programmable Gate Array" filed on Oct. 8, 2012.

FIELD OF THE INVENTION

Embodiments of the present invention relate to the field of programmable gate architectures; more particularly, embodiments of the present invention relate to programmable gate architectures with a programmable element that allows the gate architecture to be configured as a logic function or a routing function and a switching block that provides for segmented routing.

BACKGROUND

Modern FPGA fabric architecture consists of programmable segmented routing with programmable logic blocks. This baseline architecture has been in the industry for over 20 years on which most commercial FPGAs are based. Another approach is to utilize direct routing between programmable elements with fine-grain hybrid logic/routing elements such that no segmented routing is needed for this architecture.

SUMMARY OF THE INVENTION

A method and apparatus is disclosed herein for segmented and direct routing in a programmable gate array. In one embodiment, the programmable gate array comprises a plurality of programmable tiles, including at least one SHLRT having: a block configurable as a logic function or a routing function; and one or more switching blocks coupled to programmable tiles in the plurality of programmable tiles for segmented routing.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
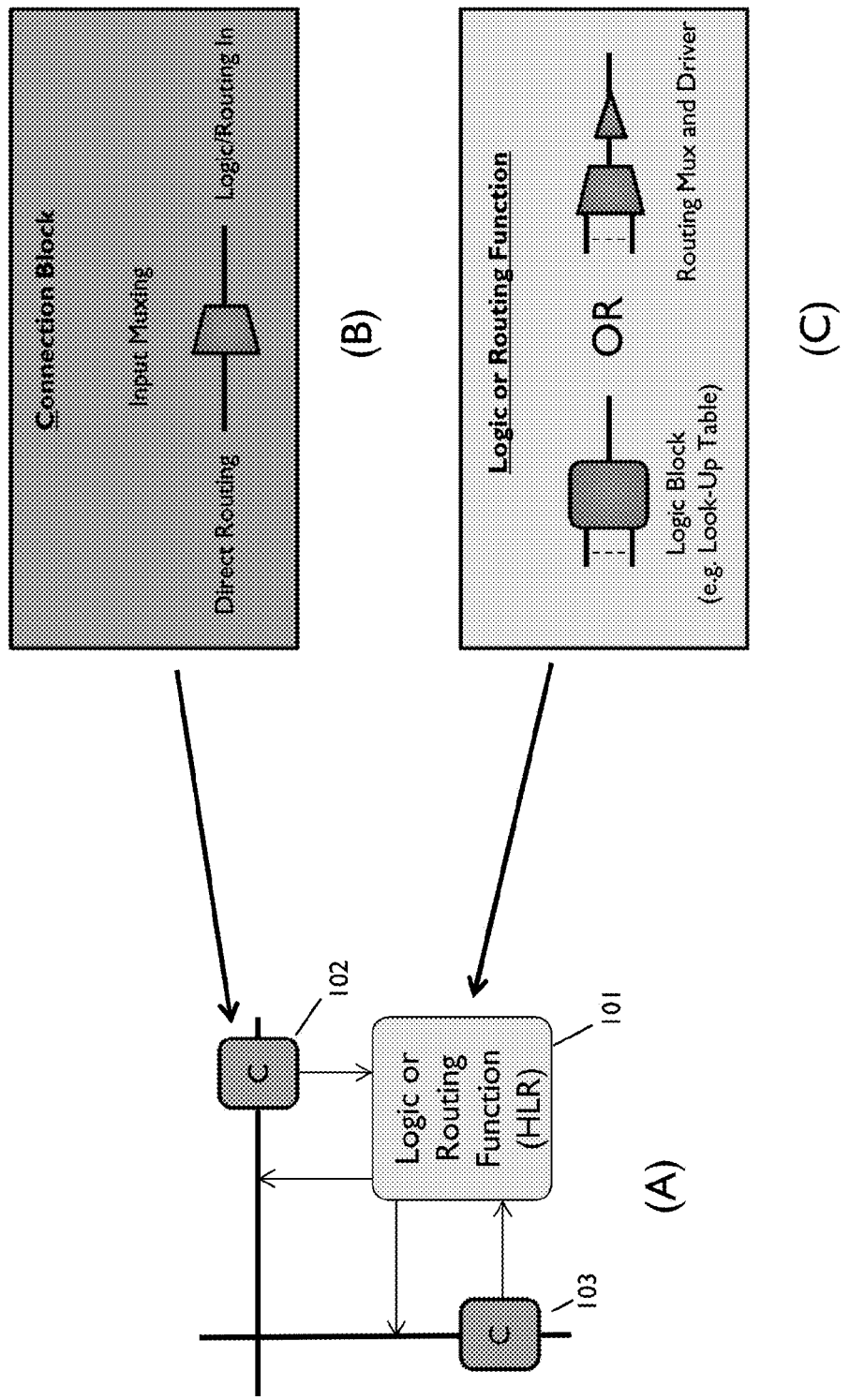
FIGS. 1A-C illustrate one embodiment of a programmable logic architecture in which each new logic tile (HLRT) can be configured as a logic function or a routing function to enable the HLRT to serve as a routing hop.

Embodiments of the present invention include a programmable gate array that has a logic/routing programmable element with direct-drive routing architecture and incorporates routing segmentation to handle longer routing and higher fanout nets more efficiently. In one embodiment, the direct-drive routing is for local and medium distance connection and the segmented routing and driver supports long distance connections to be routed (e.g., longer than the direct-drive routing. The new long routing driver also allows long-distance connections to occur by flying over tiles without impacting (e.g., blocking) any local and medium connections.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

A programmable gate architecture having multiple hybrid logic or routing tiles (HLRT) is disclosed. In one embodiment, the plurality of HLRTs forms an array of columns and rows. In one embodiment, each of the HLRTs is configurable as a logic function or a routing function. One or more switching blocks coupled to the plurality of HLRTs for segmented routing (e.g., segmented vertical routing that uses more than one segment or segmented horizontal routing that uses more than one segment) to form a new type of HLRT, called segmented hybrid logic routing tile (SHLRT).

In one embodiment, neighboring HLRTs or SHLRTs are directly connected via direct-drive routing. That is, HLRTs or SHLRTs are connected together without routing segmentation. In one embodiment, the direct-drive routing is for routing shorter distances than the segmented routing. In one embodiment, to connect an HLRT or SHLRT configured as a logic function with an external port, multiple HLRTs or SHLRTs that are configured as routing functions may be used, such that the external port is directly connected to the HLRT or SHLRT configured as the logic function and signals can be transferred through the direct connection formed by the multiple HLRTs configured as routing functions.

In one embodiment, a plurality of HLRTs or SHLRTs includes a connection block to provide input multiplexing to an HLRT or SHLRT. In one embodiment, the connection block provides input multiplexing without providing output multiplexing to routing resources. In one embodiment, each switching block includes multiplexing logic with at least two inputs and an output, one of the two inputs being directly connected to an output of a HLRs and the other inputs connected to the other long routings for long-to-long routing hopping.

In one embodiment, one or more of the HLRTs or SHLRTs are configured as a routing function and serve as a routing hub. In one embodiment, where an HLRT or SHLRT is configured as a logic function, the logic function is implemented using a look-up table structure programmed as a multiplexer.

In one embodiment, the HLRTs or SHLRTs comprise a stand-alone die. In another embodiment, the HLRTs or SHLRTs form an array that is an embedded IP core in an integrated circuit. In yet another embodiment, the HLRTs or SHLRTs form an array that is part of a stacked die arrangement.

FIG. 1A illustrates one embodiment of a programmable logic architecture in which each new logic tile (HLRT) can also serve as a routing hop or a logic function. That is, the HLRT is configurable as a logic function or a routing function. Referring to FIG. 1A, a programmable logic architecture 100 with a hybrid logic or routing function (HLR) 101 and connection blocks 102 and 103. HLR 101 is configurable as either a logic function or a routing function. FIG. 1C illustrates an HLR with selectable logic mode (e.g., n-inputs look-up table) to support any n-inputs logic functions or the same logic block can be configured as routing multiplexer (mux) and driver configurations to support routing expansion by programming the look-up table content accordingly.

For example, in one configuration, logic block in HLR 101 is implemented using a look-up table structure for any logic function that has n inputs. The same look-up table structure can be programmed as a static n-to-1 mux such that HLR 101 can serve as a routing hop to jump between routing segments, similar to the function of a switching block as in the typical modern FPGA architecture.

In one embodiment, connection blocks 102 and 103 only provide input multiplexing (muxing) to HLRs without output muxing to routing resources as occurs in a typical segmented routing architecture of the prior art. FIG. 1B illustrates the input muxing with a direct routing input and an output being sent to a logic function or a routing function provided by the HLR. Although FIG. 1B only shows one input mux, there may be more than one input mux on each connection block. Note that while two connection blocks are shown in FIG. 1A, a programmable gate architecture may have more than two connection blocks interfacing the HLR to the routing traces.

FIG. 1C illustrates an HLR with selectable logic mode (e.g., n-input look-up table) to support any n-inputs logic functions or the same logic block can be configured as routing mux and driver configurations to support routing expansion by programming the look-up table content accordingly.

For example, in one configuration, logic block in HLR 101 is implemented using a look-up table structure for any logic function that has n inputs. The same look-up table structure can be programmed as a static n-to-1 multiplexer (mux) such that HLR 101 can serve as a routing hop to jump between routing segments.

The architecture of FIGS. 1A-C provides a fast logic to logic connection to implement critical paths more efficiently than in typical segmented FPGA and is more suitable for use in implementing smaller programmable arrays in a stand-alone chip or as an embedded IP in different die because typical nets don't need to travel long distances. When a larger programmable array is needed, this architecture may have limited routing flexibility to support local routing and longer fly-over connections in the same local region.

FIGS. 2A-2D illustrate an extension of the direct-drive routing architecture shown in FIGS. 1A-C. In one embodiment, the programmable logic architecture incorporates segmentation routing that is used for long routes and direct-drive routing that is used for shorter routes. This heterogeneous routing architecture has an extra switching block to provide a long-to-long routing hop where the corresponding HLR block in the same tile is still available for implementing other logic or short/medium routing functions. In one embodiment, this dedicated long-routing switching block also provides faster routing connection than connecting through a HLR, thereby achieving high performance and long distance routing connections at the same time. In the same ways as the programmable logic architecture, the long routings can still reach a HLR directly through the connection blocks, and the HLR output can still achieve long routing through the new switching block. The combined tile is referred to herein as a segmented hybrid logic or routing tile (SHLRT).

Figure 2:
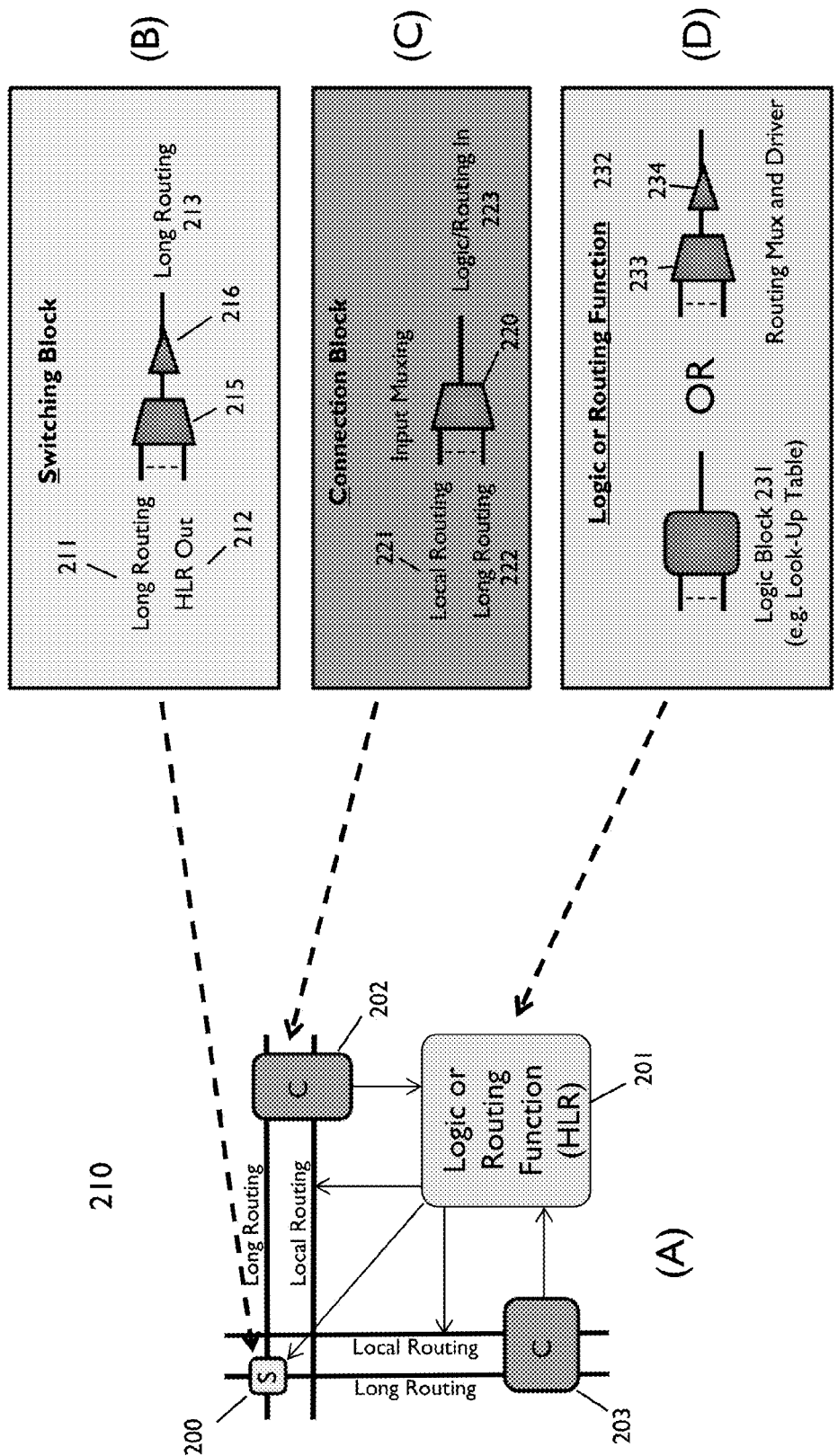
FIGS. 2A-D illustrates one embodiment of a heterogeneous segmented and direct routing architecture (SHLRT).

Referring to FIGS. 2A-2D, programmable logic architecture 210 has a logic or routing function (HLR) 201 that operates in a similar fashion to HLR 101 described in conjunction with FIG. 1. That is, as shown in FIG. 2D, logic or routing function (HLR) 201 may be configured as a logic block 231 with two or more inputs (e.g., a look-up table) or a routing function 232 with two or more inputs and one output. As shown in FIG. 2D, in one embodiment, routing function 232 includes a routing mux 233 and a driver 234 as set forth in FIG. 1C.

In one embodiment, the programmable logic architecture 200 also includes connection blocks 202 and 203. In one embodiment, connection blocks 202 and 203 only provide input multiplexing (muxing) to HLR 201 without output muxing to routing resources as occurs in a typical segmented routing architecture of the prior art. In contrast to connections blocks 102 and 103 of FIG. 1, connection blocks 202 and 203 are also coupled to and interface with long routing and local routing. This is illustrated in FIG. 2C. Referring to FIG. 2C, input muxing 220 of either of connection blocks 202 and 203 has 2 or more inputs and one output directly connected to an input of logic or routing function 201. The two or more inputs are connection to a long routing trace 222 and a local routing trace 221.

Note that while two connection blocks are shown in FIG. 2A, a programmable gate architecture may have more or less than two connection blocks interfacing the HLR to the routing traces.

Programmable logic architecture 200 also includes a switching block 200 that interfaces HLR 201 and one or more long routing traces with other long routing traces. FIG. 2B illustrates an example of a switching block. Referring to FIG. 2B, the switching block comprises one or more of mux 215 having two or more inputs that consist of an output 212 of HLR 201 and at least one long routing trace, such as long routing trace 211. Only one such mux has been shown to avoid obscuring the invention. Mux 215 generates an output to driver 216 that drives an output that is sent on a long routing trace (e.g., long routing 213).

Figure 3:
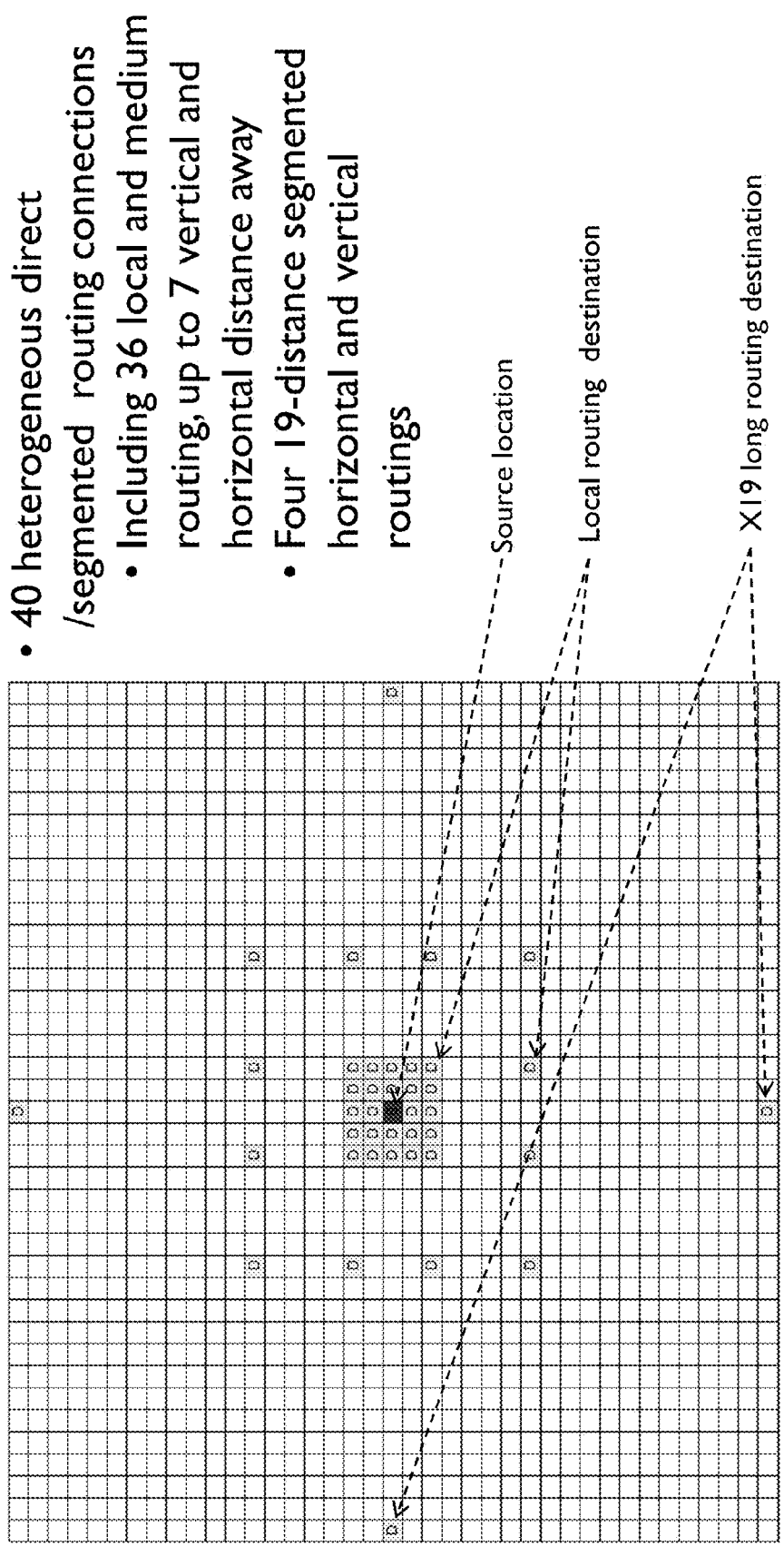
FIG. 3 illustrates an example connection map to 40 destinations for the new direct/segmented routing architecture.

FIG. 3 shows a heterogeneous routing example. Referring to FIG. 3, a SHLRT has an output that can reach 40 surrounding destinations directly. Twenty-four direct-drive destinations are the closest 24 neighboring blocks up to 2 vertical and horizontal distances away. Another 12 (of the 40) direct-drive destinations are the medium-distance destinations where they are roughly 7 vertical and/or 7 horizontal distances away. The last 4 destinations are for the segmented long-distance connections where they are exactly 19 vertical or horizontal distance away. FIG. 3 can also be referred as the fan-out map with the center source fanning out to the 40 destinations. Since this map is fully symmetric in both X and Y directions, the corresponding fan-in map is identical to this fan-out map. Replacing "S" (source) in the middle as "D" (destination) and replacing 40 "D" as "S" will be the corresponding fan-in map. In this fan-in map, 40 surrounding source locations can drive to the center destination location directly.

Figure 4:
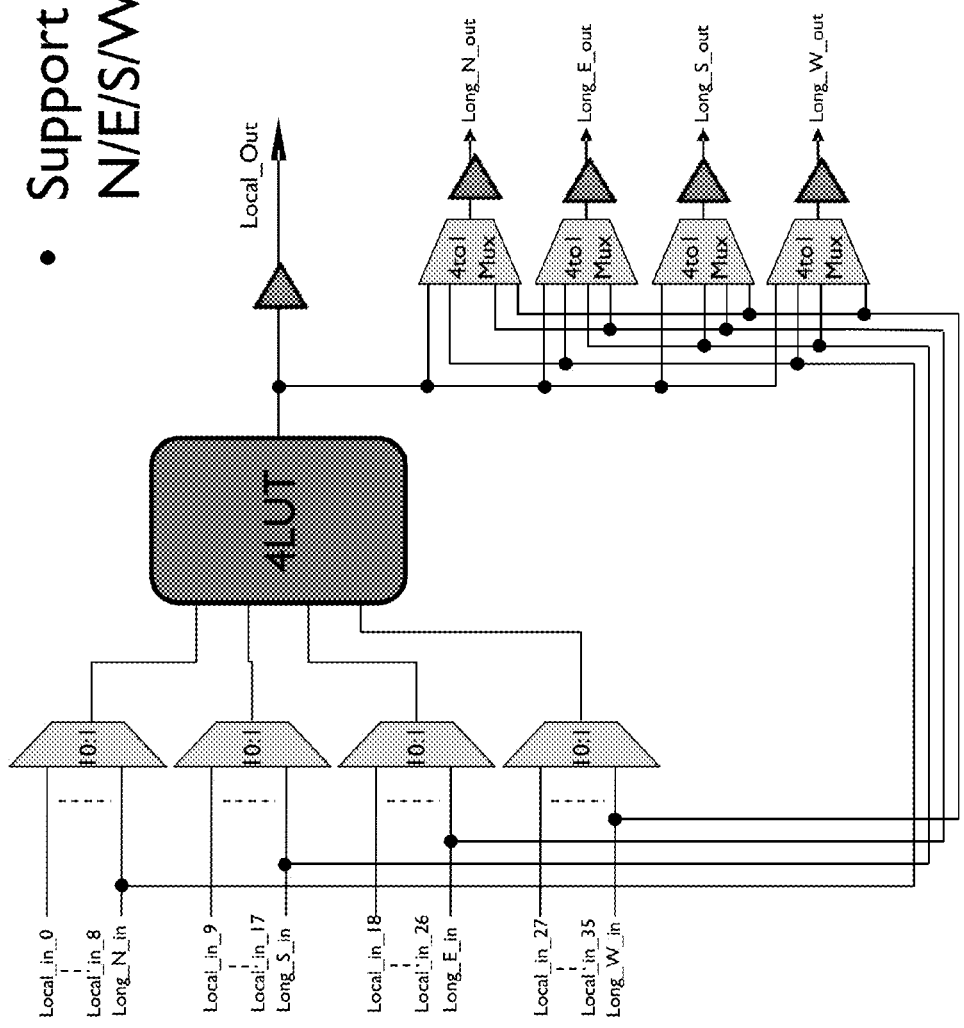
FIG. 4 illustrates a block diagram of one embodiment of a SHLRT with 4 independent segmented drivers.

FIG. 4 shows a block diagram for one implementation of the SHLRT tile. Referring to FIG. 4, the base logic block is configured as a 4 input lookup table. With 40 direct inputs coming in from 40 different source locations, four 10 input muxes are placed between 40 direct inputs and the 4 lookup table inputs. The lookup table output (labeled as local_out in FIG. 4) drives the corresponding 24 local neighbors and 12 medium distance destinations directly as shown in FIG. 3. The other four 4-to-1 mux and driver groups provide dedicated long routing resources such that up to 4 different nets can be routed to these 4 long line drivers and the SHLRT lookup table can still drive a different local net.

FIG. 4 only shows one of the possible HLRT tile structures. Other potential SHLRT tile structures include lookup tables with different numbers of inputs (e.g., 5 and 6 inputs LUTs), a SHLRT may be configured with dedicated carry and flip-flop circuitry, a lookup table with dual-port memory support, etc.

Figure 5:
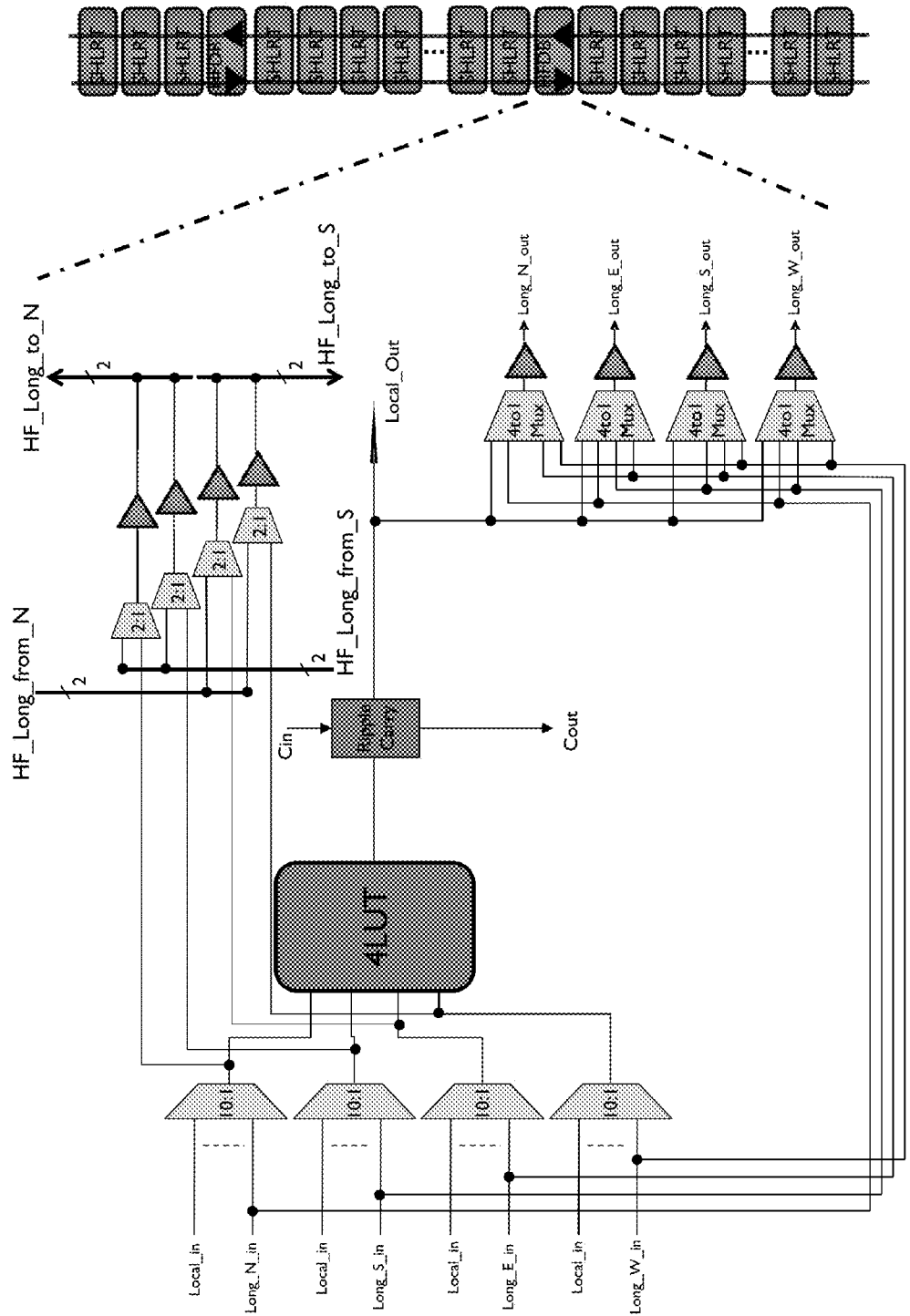
FIG. 5 illustrates one embodiment of a high-fanout driver block to support a dedicated high-fanout routing network.

FIG. 5 shows an alternative embodiment of a tile with a different type of segmented routing specifically for high fanout nets. Referring to FIG. 5, a new high fanout driver block tile is shown with the 4 corresponding high-fanout long wires (HF_long). These 4 HF_long segmented routings are inserted into specific columns to support distributing high fanout signals vertically. Two of the 4 HF_long routings are for north-to-south connections and the other 2 are for south-to-north connections. These 4 HF_long routings are sourced from the corresponding four 2-to-1 muxes within this high-fanout driver block tile and can also be used to source from the regular direct or long programmable routings from the four 10-to-1 input muxes or stitch different HF_long routings segmented together using other 2-to-1 muxes in other high fanout driver blocks to reach even more fanouts. As shown in the right hand side of FIG. 5, multiple high fanout driver blocks are placed within the SHLRT columns with the HF_long routings to provide regular ingress and rebuffering points. When this high fanout driver block is not used for the driving HF_long routings, it can be used as a regular SHLRT block to support regular logic and routing-hop functions.

Figure 6:
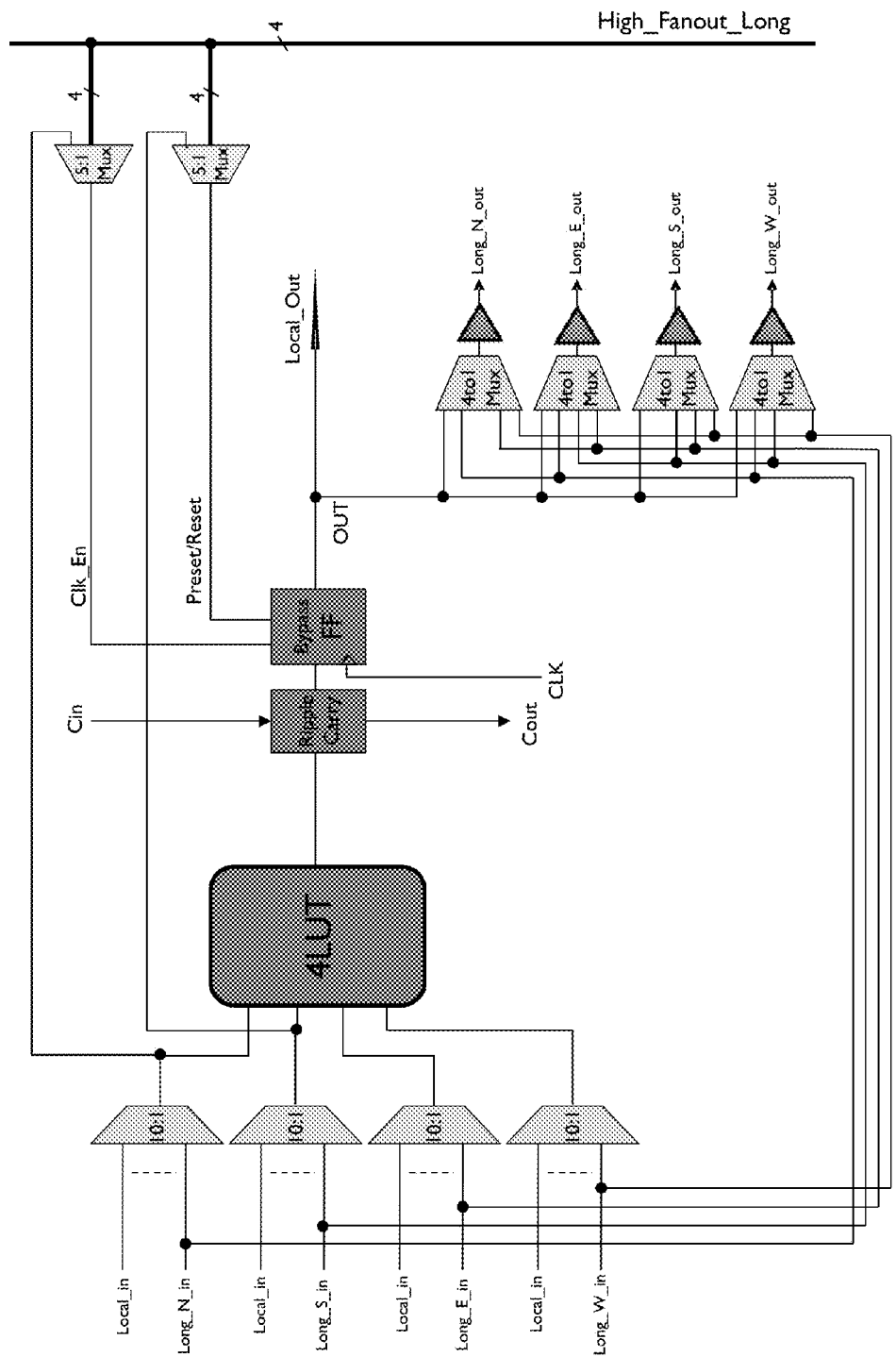
FIG. 6 illustrates an example connection from a high-fanout routing network to a flip-flop in a SHLRT tile.

FIG. 6 is a block diagram of one embodiment of a tile having an input connection from the HF_long routings. Referring to FIG. 6, a SHLRT tile has a dedicated ripple carry and bypassable flip flop. There are two 5-to-1 muxes to source clock enable and preset/reset signals from 4 HF_long routings and from the regular 10-to-1 direct_drive inputs. Typically, clock enable and preset/reset signals are shared between many flip-flops (FFs) and SHLRTs with FFs are aligned into columns. This high fanout long routing segmentation can support these control-signal functions within the corresponding columns.

Although the example in FIG. 6 is primarily used for high fanout control signals, the high fanout routing segmentation architecture can be extended to cover other kinds of high fanout signals in control or data paths by adding extra connections from the two 5-to-1 muxes from the high-fanout routings to the 10-to-1 input muxes so that the high fanout network can reach lookup table inputs directly.

Figure 7:
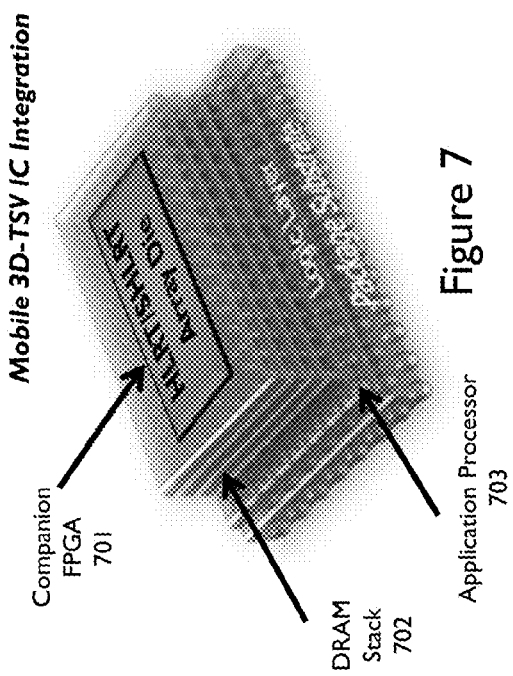
FIG. 7 illustrates an example integrated circuit integration of an SHLRT array in a stacked dies arrangement.
Figure 8:
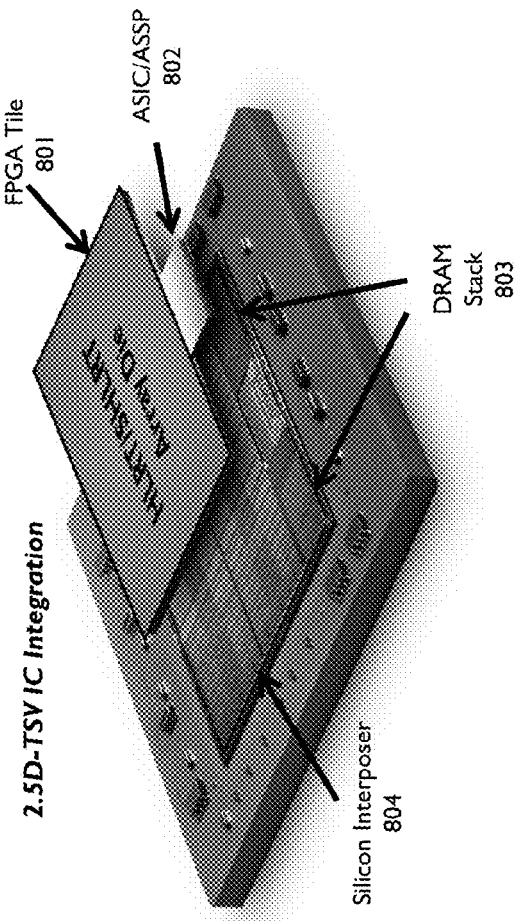
FIG. 8 illustrates another example integrated circuit integration of an SHLRT array onto a 2.5 D silicon interposer arrangement.
Figure 9:
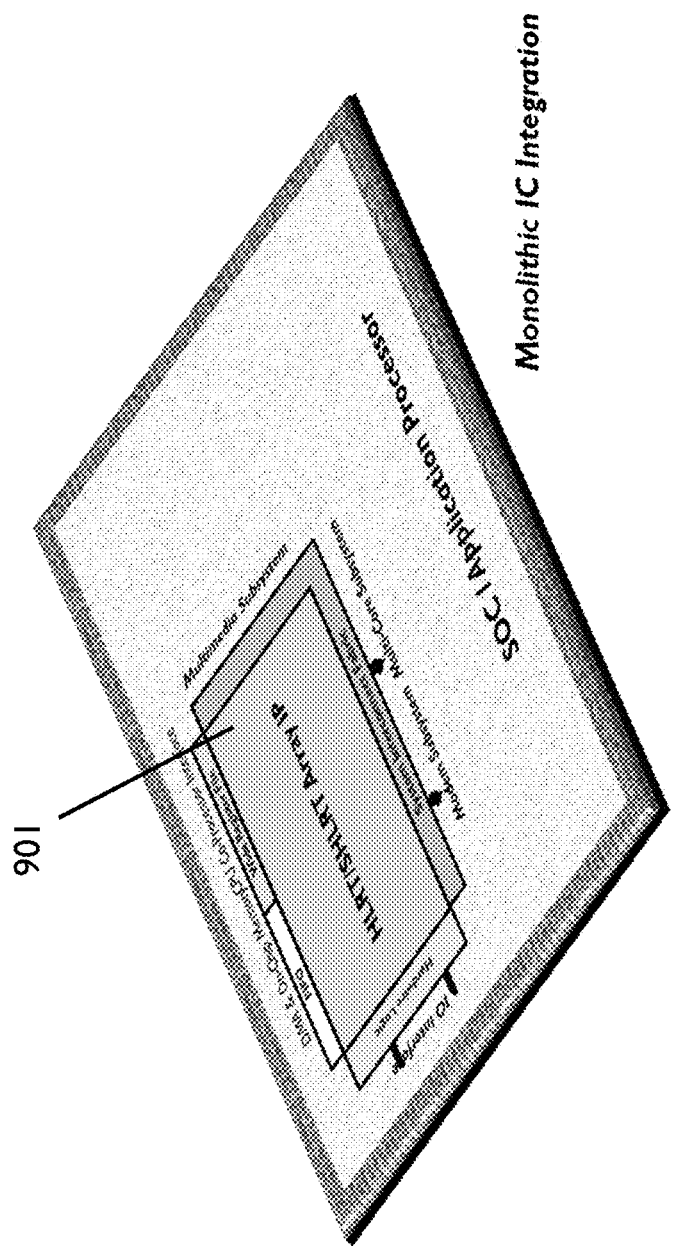
FIG. 9 illustrates an example monolithic integrated circuit integration of an SHLRT array are part of a processor in monolithic IC integration.

FIGS. 7-9 illustrate example integrated circuit (IC) integrations with HLRT or SHLRT arrays. More specifically, FIG. 7 illustrates an example integrated circuit integration of an HLRT or SHLRT array in a stacked dies arrangement. Referring to FIG. 7, FPGA 701 comprising an HLRT or SHLRT array is stacked on DRAM stack 702, which is stacked on top of application processor 703. Application processor 703 is attached to a package substrate as in a typical 3D integration.

FIG. 8 illustrates another example integrated circuit integration of an HLRT or SHLRT array onto a silicon interposer on top of package substrate. Referring to FIG. 8, an FPGA tile 801 consisting of an HLRT or SHLRT array die is stacked on top a silicon interposer 804 with an ASIC/ASSP 802 and two DRAM stacks 803 stacked on the same interposer 840. In one embodiment, connections between these components include through silicon vias (TSVs). Silicon interposer 804 is connected to a package substrate as in a typical 2.5 D integration.

FIG. 9 illustrates an example monolithic integrated circuit integration of an HLRT or SHLRT array are part of a processor. Referring to FIG. 9, an HLRT or SHLRT array IP 901 consisting of multiple HLRTs or SHLRTs is shown integrated into a monolithic IC. In one embodiment, the monolithic IC comprises an system-on-a-chip (SOC) and/or application processor.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A field programmable gate array (FPGA) comprising:
a plurality of programmable tiles, each tile of the plurality of tiles comprising a logic block that is operable to be programmed at different times to perform only a logic function or only a routing function, wherein at least a first one of the tiles comprises
a first logic block comprising a look-up table that is configured to perform the logic function;
one or more switching blocks coupled to the first logic block, the one or more switching blocks comprising an input coupled to a first segmented routing connection and an output coupled to a second segmented routing connection;
wherein the plurality of programmable tiles comprise a set of second tiles that are separated from the at least first one of the tiles by one or more third tiles, wherein an output of the at least first one of the tiles is directly connected to at least one of the second tiles via at least one of the third tiles comprising the look-up table that is configured as a routing multiplexer coupled to a driver to perform the routing function.

2. The FPGA defined in claim 1 wherein each of the one or more switching blocks includes a multiplexing logic with at least two inputs and an output, a first one of the two inputs being directly connected to an output of the first logic block and a second one of the two inputs being coupled to an output of a second connection block interfacing the first logic block with at least the first segmented connection, wherein the output of the multiplexing logic is coupled to a driver to drive the output coupled to a second segmented routing connection, and wherein the output of the switching block is coupled to an input of a first connection block interfacing the first logic block with at least the second segmented connection.

3. The FPGA defined in claim 1 wherein the segmented connection is segmented vertical routing that uses more than one segment or segmented horizontal routing that uses more than one segment.

4. The FPGA defined in claim 1 wherein the third tiles comprises twenty four neighboring tiles that are directly connected via direct-drive routing to the at least the first one of the tiles.

5. The FPGA defined in claim 4 wherein the direct-drive routing is for routing shorter distances than the segmented routing.

6. The FPGA defined in claim 1 wherein the at least one of the third tiles serves as a routing hub.

7. The FPGA defined in claim 1 further comprising
a first connection block to input the second segmented routing connection and a local routing connection, and to provide an output to the first logic block.

8. The FPGA defined in claim 7 wherein the first connection block is to provide input multiplexing to the first logic block without providing output multiplexing to routing resources.

9. The FPGA defined in claim 1 further comprising an external port that is directly connected to the first logic block via the at least one of the third tiles.

10. The FPGA defined in claim 1 wherein the plurality of programmable tiles form an array of columns and rows.

11. The FPGA defined in claim 1 wherein the plurality of tiles comprises one or more tiles that are part of a stand-alone die.

12. The FPGA defined in claim 1 wherein the plurality of tiles comprises one or more tiles that form an array that is an embedded core in an integrated circuit.

13. The FPGA defined in claim 1 wherein the plurality of tiles comprises one or more tiles that form an array that is part of a stacked die arrangement.

14. A field programmable gate array (FPGA) comprising:
an external port to transfer signals;
a plurality of tiles forming an array of rows and columns, each tile of the plurality of tiles comprising a logic block that is operable to be programmed at different times to perform only a logic function or only a routing function, wherein at least a first one of the tiles comprises
a first logic block comprising a look-up table that is configured to perform the logic function;
one or more switching blocks coupled to the first logic block, the one or more switching blocks comprising an input coupled to a first segmented routing connection and an output coupled to a second segmented routing connection, wherein the plurality of programmable tiles comprise a set of second tiles that are separated from the at least first one of the tiles by one or more third tiles, wherein an output of the at least first one of the tiles is directly connected to at least one of the second tiles via at least one of the third tiles comprising the look-up table that is configured as a routing multiplexer coupled to a driver to perform the routing function.

15. The FPGA defined in claim 14 wherein each of the one or more switching blocks includes a multiplexing logic with at least two inputs and an output, a first one of the two inputs being directly connected to an output of the first logic block and a second one of the two inputs being coupled to an output of a second connection block interfacing the first logic block with at least the first segmented connection, wherein the output of the multiplexing logic is coupled to a driver to drive the output coupled to a second segmented routing connection, and wherein the output of the switching block is coupled to an input of a first connection block interfacing the first logic block with at least the second segmented connection.

16. The FPGA defined in claim 15, further comprising
a first connection block to input the second segmented routing connection and a local routing connection, and to provide an output to the first logic block.

17. The FPGA defined in claim 16 wherein the first connection block is to provide input multiplexing to the first logic block without providing output multiplexing to routing resources.

18. The FPGA defined in claim 14 wherein the direct-drive routing is for routing shorter distances than the segmented routing.

19. The FPGA defined in claim 14 wherein the plurality of tiles are part of a stand-alone die.

20. The FPGA defined in claim 14 wherein the plurality of tiles forms an array that is an embedded core in an integrated circuit or part of a stacked die arrangement.

* * * * *